(12) United States Patent
Wang et al.

(10) Patent No.: US 6,603,599 B1
(45) Date of Patent: Aug. 5, 2003

(54) LINEAR SEMICONDUCTOR OPTICAL AMPLIFIER WITH BROAD AREA LASER

(75) Inventors: Steve Wang, San Jose, CA (US); Frank Levinson, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/134,896

(22) Filed: Apr. 29, 2002

Related U.S. Application Data
(60) Provisional application No. 60/358,036, filed on Feb. 19, 2002.

(51) Int. Cl.[7] ................................................. H01S 3/00
(52) U.S. Cl. ...................................................... 359/344
(58) Field of Search .................................. 359/344, 337

(56) References Cited

U.S. PATENT DOCUMENTS 5,436,759 A * 7/1995 Dijaili et al. ............... 359/333
5,737,352 A * 4/1998 Tiemeijer et al. ............. 372/45
6,456,429 B1 * 9/2002 Wu ............................. 359/344

FOREIGN PATENT DOCUMENTS

JP           410107310 A   *  4/1998

* cited by examiner

Primary Examiner—Mark Hellner
(74) Attorney, Agent, or Firm—Workman, Nydegger & Seeley

(57) ABSTRACT

A semiconductor optical amplifier for eliminating cross talk. The semiconductor optical amplifier includes a waveguide ridge that is formed on a broad area semiconductor laser. The ridge has angled facets and guides incident optical signals through the active region. When lasing, the broad area semiconductor laser locks the carrier density and photon density such that an incident optical signal does not affect the carrier density or the photon density. Thus, the broad area laser and the semiconductor optical amplifier share the same active region or gain medium and cross talk is eliminated when multiple optical signals are incident on the semiconductor optical amplifier.

21 Claims, 3 Drawing Sheets

LINEAR SEMICONDUCTOR OPTICAL AMPLIFIER WITH BROAD AREA LASER

RELATED APPLICATION

This application claims the benefit of U.S. Provisional Patent Application Serial No. 60/358,036, entitled "Linear Semiconductor Optical Amplifier with Broad Area Laser," filed Feb. 19, 2002, which is incorporated herein by reference.

BACKGROUND OF THE INVENTION

1. The Field of the Invention

The present invention relates to the field of integrated optics including a semiconductor optical amplifier that reduces cross talk. More particularly, the present invention relates to a semiconductor optical amplifier that reduces or eliminates cross talk while using the gain medium of a broad area semiconductor laser to amplify the optical signals.

2. Background and Relevant Art

Optical communication systems have several advantages over other types of telecommunications networks. Optical fibers are typically made from insulative materials and are therefore less susceptible to interference from electromagnetic sources. Optical fibers also have higher bandwidth capability for both analog and digital forms of data. In addition, optical fibers are both smaller and lighter than metal cables.

As optical signals are transmitted through the optical fibers of a communication network, the optical signals gradually become weaker over distance. Thus, the optical signals need to be refreshed or strengthened before the signals become too weak to detect. Before the advent of optical amplifiers, regenerators were used to refresh or strengthen the weakened optical signals. Regenerators convert the optical signal to an electrical signal, clean the electric signal, and convert the electrical signal back to an optical signal for continued transmission in the optical communication network.

Optical amplifiers, on the other hand, are superior to regenerators for several reasons. Optical amplifiers are not as sensitive to bit rates and modulation formats as regenerators. Optical amplifiers can also be used with multiple wavelengths while regenerators are often specific to a particular wavelength.

Erbium-doped optical amplifiers have been used to amplify optical signals directly without requiring conversion of the optical signal to an electrical signal and back to an optical signal. These optical amplifiers are pumped optically by an external source of energy, such as 980 nm and 1480 nm semiconductor lasers, to excite electrons in an erbium-doped section of an optical fiber. As an optical signal passes through the erbium-doped fiber, the excited electrons emit photons having the same wavelengths as the incident optical signal, thereby amplifying the optical signal. Erbium-doped optical amplifiers are particularly useful in wavelength division multiplexing (WDM) optical networks, since they generally do not generate cross talk between the various wavelengths. One significant drawback of erbium-doped optical amplifiers is their cost. In particular, the semiconductor lasers are quite expensive, and can typically raise the cost per amplifier to tens of thousands of dollars.

Another, less expensive, type of optical amplifier is a semiconductor optical amplifier (SOA), which are pumped electrically as opposed to the optical pumping of erbium-doped optical amplifiers. At a basic level, a semiconductor optical amplifier is created by joining a p-type semiconductor material with an n-type semiconductor material to form an active region in the depletion region of the pn-junction when the semiconductor optical amplifier is forward biased. Optical signals are amplified by the stimulated emission of photons as the optical signal propagates through the active region of the semiconductor optical amplifier.

Instead of simply using a pn-junction as the basis of the semiconductor optical amplifier, another semiconductor material is formed at the pn-junction of the semiconductor materials. The new semiconductor layer typically has a higher refractive index than the adjacent p-type and n-type semiconductor regions. This is useful to help confine the light to the active region of the semiconductor optical amplifier.

One of the drawbacks of semiconductor optical amplifiers is a phenomenon referred to as cross talk, particularly when wavelength division multiplexing (WDM) is used. When an optical signal is input to a semiconductor optical amplifier, the carriers in the gain region of the semiconductor optical amplifier are reduced. More specifically, the carrier concentration is reduced through stimulated emission and/or spontaneous emission. When another optical signal is also incident to the semiconductor optical amplifier, the carrier concentration has already been reduced by the first optical signal and the second optical signal will experience less gain. It is possible for the second optical signal to be absorbed in certain instances. Thus, the optical signal affect each other in ways that are detrimental to the amplification process.

Cross talk occurs because the transition of electrons from the high energy state to the lower energy state occurs very fast in semiconductor optical amplifiers. This enables the gain of the semiconductor optical amplifier to respond according to fluctuations of the input signal. As a result, semiconductor optical amplifiers are not suited for the amplification of multiple optical signals of varying wavelengths because of the detrimental effect of cross talk. Thus, more expensive erbium-doped optical amplifiers are widely used in WDM optical networks even though their cost is significantly higher than that of SOAs.

BRIEF SUMMARY OF THE INVENTION

These and other problems are overcome by the present invention which is directed to a semiconductor optical amplifier that eliminates cross talk between optical signals that are being amplified. The present invention also relates to methods of manufacturing semiconductor optical amplifiers that substantially eliminate cross talk between optical signals. Thus, SOAs constructed according to the invention can be used in WDM optical networks, and are significantly less expensive than the erbium-doped optical amplifiers that have been conventionally used in such optical networks.

The semiconductor optical amplifier includes a broad area laser with an active region that includes quantum wells. Typically, some of the quantum wells are compressively strained while other quantum wells are tensile strained. The semiconductor optical amplifier also includes a polarization adjusting layer whose thickness can be adjusted after manufacturing such that the transverse electric mode gain of the semiconductor optical amplifier substantially balances the transverse magnetic mode gain of the semiconductor optical amplifier. In effect, the polarization adjusting layer makes the semiconductor optical amplifier polarization independent.

When the broad area laser is lasing, the photon and carrier densities within the active region are at a threshold level and are substantially uniform across the active region. The facets at either end of the semiconductor optical amplifier are substantially perpendicular to the direction of the laser light, thereby reflecting the light and enabling the gain medium to operate as a laser. A ridge waveguide formed on the semiconductor optical amplifier structure guides optical signals incident in the active region through the semiconductor optical amplifier. The optical signals pass through the gain medium that is shared by the broad area laser, but at an angle that is displaced from the direction of the light generated by the laser. Because of the angular displacement of the optical signal, the optical signal is effectively not reflected internally in the gain medium and, therefore, is merely amplified instead of acquiring laser characteristics.

The incident optical signals experience gain without depleting the photon density or the carrier density. As a result, cross talk is substantially eliminated as the semiconductor optical amplifier shares the same gain medium as the broad area laser. In this manner, the semiconductor optical amplifiers of the invention can be used in a variety of optical networks, including WDM optical networks, replacing the more expensive erbium-doped optical amplifiers.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
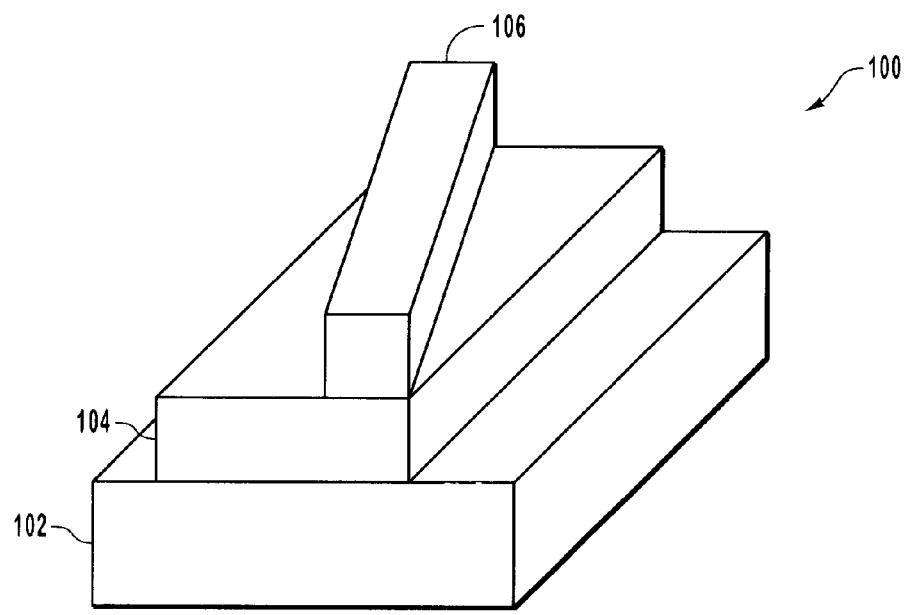
FIG. 1 illustrates a perspective view of a semiconductor optical amplifier that is able to substantially reduce or eliminate cross talk between optical signals that are amplified by the semiconductor optical amplifier.

Semiconductor optical amplifiers (SOAs) typically amplify light signals through the principle of stimulated emission. A semiconductor optical amplifier has a conduction band for high mobility electrons, and two valence bands of low mobility holes: a light hole valence band and a heavy hole valence band. The valence band(s) and the conduction band are separated by an energy gap and no energy levels exist in the energy gap. When an electron from the conduction band transitions to the light hole valance band, the gain is TE mode gain and when the transition is from the conduction band to the heavy hole valence band, the gain is TM mode gain. The conduction band is typically the higher energy band and the energy refers to electron energy.

If no bias is applied to the semiconductor optical amplifier, the concentration of electrons in the conduction band is relatively small. When a forward bias is applied to the semiconductor optical amplifier (often a pn-junction) a population inversion may be achieved such that the concentration of electrons in the conduction band is significantly higher. In the presence of an optical signal, more electrons are exiting the conduction band to the valence band by the process of stimulated emission than there are electrons going from the valence band to the conduction band. When an electron transitions from a higher energy level to a lower energy level, a photon is emitted that has the same energy and wavelength as the incident photon. These emitted photons thus amplify the optical signal.

Typically however, the SOAs used to amplify optical signals are more complex than a simple pn-junction. Often, another semiconductor material is sandwiched or formed between the p-type and n-type regions of the SOA to form an active region or layer. The bandwidth of the active layer is $E_g$ and the active region may include two optical confinement layers which have a band gap of $E_g+\Delta E_g$. The extra bandwidth is for the carrier confinement. Often, the active region is a strip of semiconductor materials that is surrounded by p and n type semiconductor materials (cladding layers) that have lower refractive indexes. The active region typically has a higher refractive index than the surrounding p-type and n-type regions of the SOA, thus confining the light during amplification to the active region. The active region may also have a smaller energy band gap than surrounding layers in order to confine the carriers that are injected into the active region.

As previously described, the active region of an semiconductor optical amplifier can introduce some undesirable effects. In particular, cross talk is a significant problem when more than one channel is being amplified because of the short emission lifetime of electrons in semiconductor optical amplifiers. The short lifetime enables the electrons to quickly and easily respond to power fluctuations of the signals being amplified. This reduces the applicability of semiconductor optical amplifiers when used to amplify multiple channels. The present invention is directed to a semiconductor optical amplifier that substantially reduces or eliminates cross talk and enables the semiconductor optical amplifier to amplify multiple channels at the same time regardless of the emission lifetime of the electrons that make the transition from a high energy state to a low energy state.

FIG. 1 is a perspective view of a semiconductor structure 100. The semiconductor structure 100 combines a broad area semiconductor laser with a semiconductor optical amplifier. The semiconductor optical amplifier 100 includes a substrate 102, a broad area semiconductor laser 104 and a ridge waveguide 106. The semiconductor structure 100 uses the same gain medium or active region for both the broad area laser and the semiconductor optical amplifier. The ridge waveguide 106 is angled with respect to the broad area semiconductor laser 104, which causes the optical signal that is to be amplified to pass through the gain medium at an angle that is displaced from the direction of operation of the laser.

Figure 2:
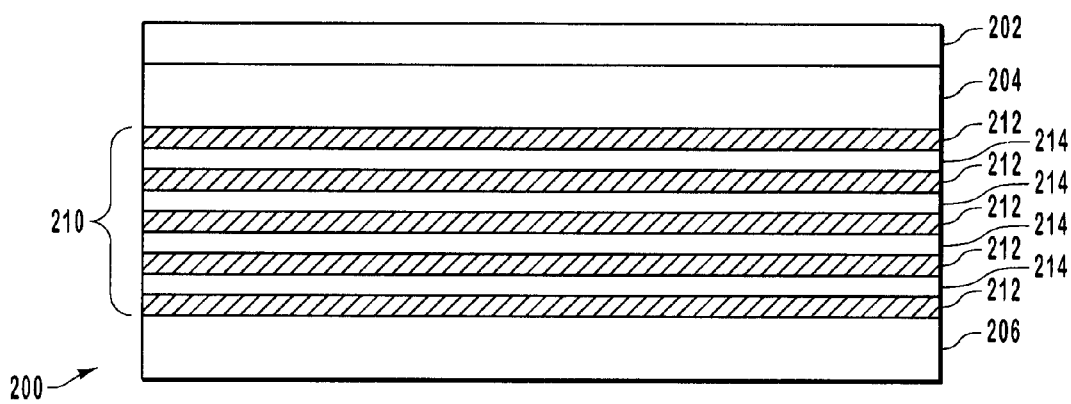
FIG. 2 illustrates both an active region that is bounded by optical confinement layers to confine an optical signal to the active region and a polarization adjusting layer used to alter a confinement factor of the active region such that an optical signal can be repositioned within the active signal according to a thickness of the polarization adjusting layer.

FIG. 2 illustrates an exemplary active region 210 that serves as the gain medium for both the broad area semiconductor laser and the angle facet semiconductor optical amplifier. FIG. 2 is an end view of one of two facets of the semiconductor structure that includes the active region 210. Thus, when active region 210 is used for lasing, the laser light is reflected internally and in the direction into and perpendicular to the page by the facet illustrated in FIG. 2.

The active region 210 includes a plurality of quantum wells 212 that are separated by a barrier layers 214. The active region 210 is bounded by an optical confinement layers that are illustrated as optical confinement layer 204 and optical confinement layer 206. The optical confinement layers are formed from n-type or p-type semiconductor materials. For example, the optical confinement layer 204 may be formed from a p-type semiconductor material while the optical confinement layer 206 may be formed from an n-type semiconductor material. The active region 210, which forms a strip in the plane between the optical confinement layers 204 and 206, is typically formed from a semiconductor material that is different from the optical confinement layers 204 and 206. In particular, the active region 210 typically has a refractive index that is greater than the refractive index of the bounding or surrounding optical confinement layers. This helps to confine a propagating optical signal to the active region 210.

As previously stated, the active region 210 includes a plurality of quantum wells. While not a requirement of the present invention, some of the quantum wells 212 are compressively strained quantum wells that contribute to the transverse electric (TE) gain of optical signals. Some of the quantum wells 212 are tensile strained quantum wells that contribute to the transverse magnetic (TM) gain of optical signals. In this example, the tensile strained quantum wells are formed near the optical confinement layer 206 while the compressively strained quantum wells are formed on the tensile strained quantum wells and are nearer the optical confinement layer 204.

Forming the quantum wells such that the compressively strained quantum wells effectively form a layer that is separate from the tensile strained quantum wells enables a polarization adjusting layer 202 to make the semiconductor optical amplifier independent of the polarization of an optical signal. The polarization adjusting layer 202 has a thickness that can be formed after the laser or semiconductor optical amplifier is manufactured. By altering the thickness of the polarization adjusting layer 202, an intensity or position of an optical signal can be changed within the active region 210 such that the TM mode gain substantially balances the TE mode gain. By forming the compressively strained quantum wells and the tensile strained wells separately, the thickness of the polarization adjusting layer 202 can be adjusted after the semiconductor optical amplifier/laser is manufactured such that the TE mode gain and the TM mode gain are substantially balanced.

The polarization adjusting layer 202 and the techniques for achieving a substantial degree of polarization independence are described in greater detail in U.S. Provisional Patent Application Serial No. 60/358,051, entitled "Polarization Independent Semiconductor Optical Amplifier," filed Feb. 19, 2002, which is incorporated herein by reference. While these polarization adjusting techniques can provide advantages when used with the invention, they are not necessary for the operation of the semiconductor optical amplifiers that share a gain medium with a broad area laser as disclosed herein.

Figure 3:
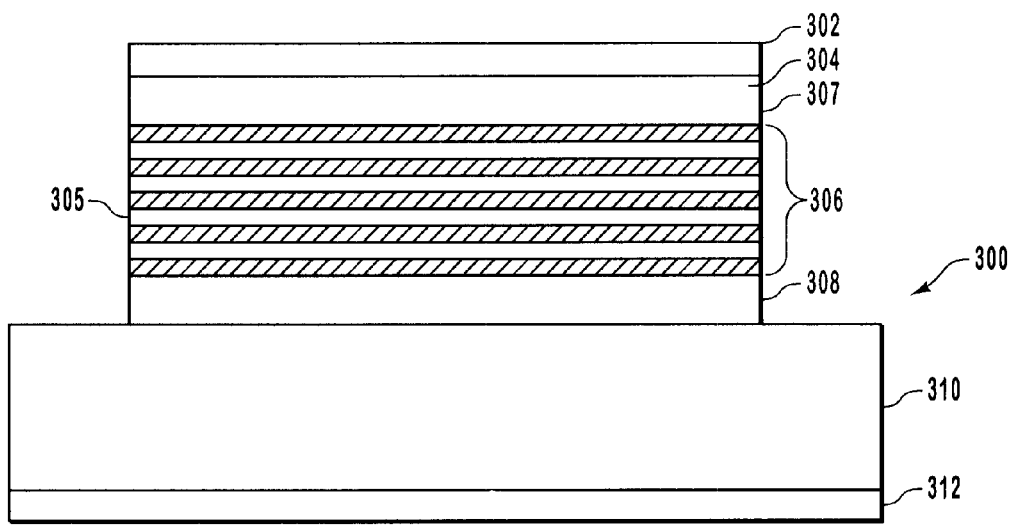
FIG. 3 illustrates a broad area laser that uses the active region of FIG. 2 as a gain medium.

FIG. 3 is an end view of a semiconductor structure having a gain medium or active region that is used by a broad area laser as described in FIG. 2. The semiconductor structure 300 includes an active region 306 that is bounded by an optical confinement layer 308 and an optical confinement layer 304. The active region 306 acts as a strong guide because of the difference in refractive indices of the active region and the surrounding optical confinement layers. This also ensures that that photon density inside the active region is uniform. The gain medium is typically formed on a substrate layer 310. Metal contacts 302 and 312, which are used for electrically pumping the broad area laser and the associated optical amplifier, are also illustrated.

In this example, the ends, or facets, of the active region 306, one of which is shown in the end view of FIG. 3, are parallel to each other and cleaved. If the gain of the active region and the reflectivity of the facets are sufficient, the active region of semiconductor structure 300 will begin to spontaneously produce light output, even without an input optical signal. When light is produced, the broad area laser 300 has reached a lasing threshold. After the lasing threshold is reached, or when the broad area laser 300 is lasing, the carrier density of the active region or gain medium is locked to a threshold current density. The broad area laser 300 supports many different modes and is functions as a strong wave guide as previously stated. Thus, the carrier density and photon density across the active region is substantially uniform.

The broad area laser that operates in semiconductor structure 300 has a direction of operation that is perpendicular to the facets at either end of the laser, due to the repeated reflection of the laser light between the two partially reflective facets. Thus, semiconductor structure 300 supports a laser that has a direction of operation that is perpendicular to the facets at either end of the laser.

Figure 6:
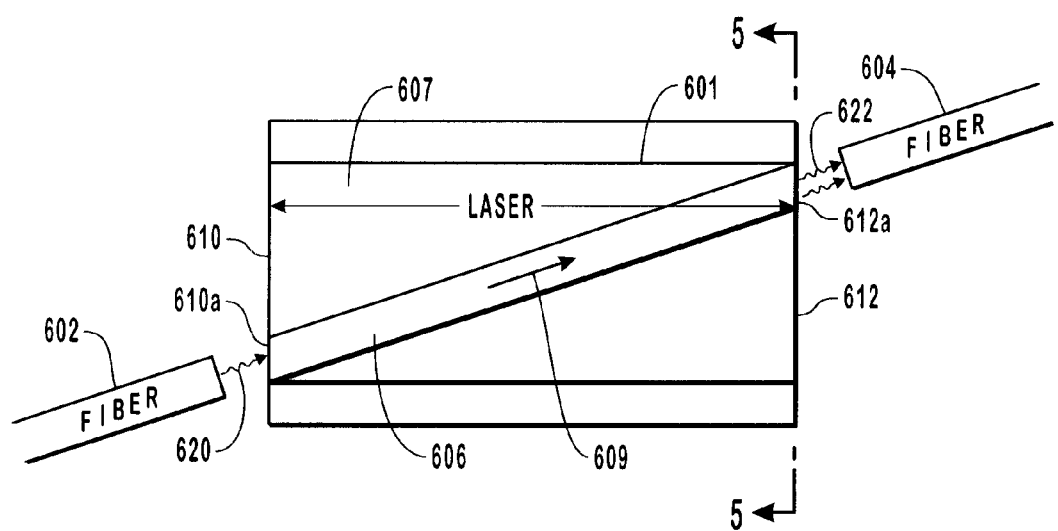
FIG. 6 illustrates a system for amplifying multiple channels using a semiconductor optical amplifier without cross talk, showing the angular displacement of the amplified optical signal with respect to the direction of operation of the associated broad area laser.

FIG. 6 is a top view of a semiconductor structure 601 that includes a semiconductor optical amplifier that is constructed according to the invention as it is used to amplify a signal that is received from an optical fiber. As discussed above in reference to FIG. 4, the broad area laser that shares the gain medium with the semiconductor optical amplifier has a direction of operation that is perpendicular to the facets 610 and 612 at either end of the laser. The laser light propagates in the direction shown by arrow 607 of FIG. 6.

The gain medium of semiconductor structure 601 also operates as a semiconductor optical amplifier that has a direction of operation shown by arrow 609 of FIG. 6. The direction of operation 609 of the optical amplifier is angularly displaced from the direction of operation 607 of the laser. As the lasing threshold has been reached, and as the carrier density of the gain medium is locked during the operation of the broad area laser, an incident optical signal 620 is received by semiconductor structure 601 from input optical fiber 602. In this example, it is assumed that incident optical signal 620 is a WDM signal, such that it includes multiple wavelengths.

The incident optical signal 620 passes through portion 610a of the facet of the semiconductor structure and enters the gain medium, which has a carrier density that has reached the lasing threshold. Thus, the incident optical signal stimulates the energized electrons in the gain medium to emit photons having the same wavelength as the incident signal. In this manner, the incident optical signal is amplified using the same gain medium as is used by the broad area laser. Moreover, because the carrier density has reached the lasing threshold, the carrier density of electrons is not depleted by the incident optical signal and, as a result, cross talk is not generated between the various wavelengths of the amplified WDM signal.

Cross talk, as previously described, results when the interaction between a first channel and the gain medium contaminates the interaction between a second channel and the same gain medium. In the gain medium of semiconductor optical amplifiers, the carrier lifetime of the electrons in on the order of nanoseconds, while the carrier lifetime of the electrons in an Erbium doped amplifier, for example, is on the order of microseconds. The short carrier lifetime of electrons causes cross talk. In the present invention, the carrier density of the gain medium is locked to the threshold carrier density when lasing occurs in the gain medium. The electrons above the carrier density are directly converted to photons on the order of femtoseconds. The interaction of a first channel with the gain medium does not change the carrier density and the interaction of the second channel with the same gain medium is therefore not affected and cross talk is eliminated.

Because the incident optical signal has a direction of operation 609 that is at an angle with respect to the direction of operation 607 of the laser that shares the gain medium, the amplified optical signal is not significantly reflected internally. Thus, the incident optical signal is amplified, but does not obtain laser characteristics. In one embodiment, the direction of operation of the semiconductor optical amplifier is displaced from the direction of operation of the laser in a range between about 7° and about 12°. Assuming that the internal reflectivity of the facets 610 and 612 for light perpendicular thereto (i.e., laser light) is about 35%, the internal reflectivity of the optical signal is typically in the range between about 0.5% and 1% when the angular displacement is in the range described above. While angular displacements in the range set forth above is advantageous, the invention can also be practiced at other angular displacements that are sufficient to reduce the internal reflectivity of the amplified optical signal.

The incident optical signal can be guided through the gain medium using a ridge waveguide 606 that is further described below in reference to FIGS. 4 and 5. After the incident signal passes through the gain medium of semiconductor structure 601 and is amplified, the signal passes through portion 612a of the facet of the semiconductor structure as amplified optical signal 622 and enters output optical fiber 604.

A semiconductor optical amplifier/broad area laser wafer can be fabricated by growing the material on an appropriate substrate, such as an InP substrate. The type III–V materials are grown using, for example, molecular beam epitaxy (MBE) or metal organic chemical vapor phase deposition (MOCVD). A buffer layer is grown and then the device structure is grown beginning with the n-type semiconductor material layer (cladding layer). Next, the n-SCH layer is grown, followed by the quantum wells and barrier layers. Next, the p-SCH layer is grown followed by the polarization adjusting layer, if needed for polarization independence. Next, the p-type layer (cladding layer) is grown followed by the p-contact layer.

Once a wafer is formed, the broad area laser is formed. In one example, the laser has a stripwidth on the order of 70 micrometers. The broad area laser is formed by etching a mesa on the wafer using, for example, wet etching. A tilted ridge guide is formed on the mesa or on the laser. The width of the ridge is on the order of 3 micrometers and is tilted, for example, from 7 to 10 degrees. This is performed by a masking process such that a reactive ion etching can be performed using a mask.

Next, the wafer is lapped to remove, in one example, some or all of the substrate and some or all of the epitaxy layer. This reduces the thickness of the semiconductor optical amplifier. The wafer is cleaved and tested as a laser and as an amplifier. The performance of the amplifier can be improved by coating the semiconductor optical amplifier with an antireflective coating as described herein. Coating the semiconductor optical amplifier, however, is not required.

Figure 4:
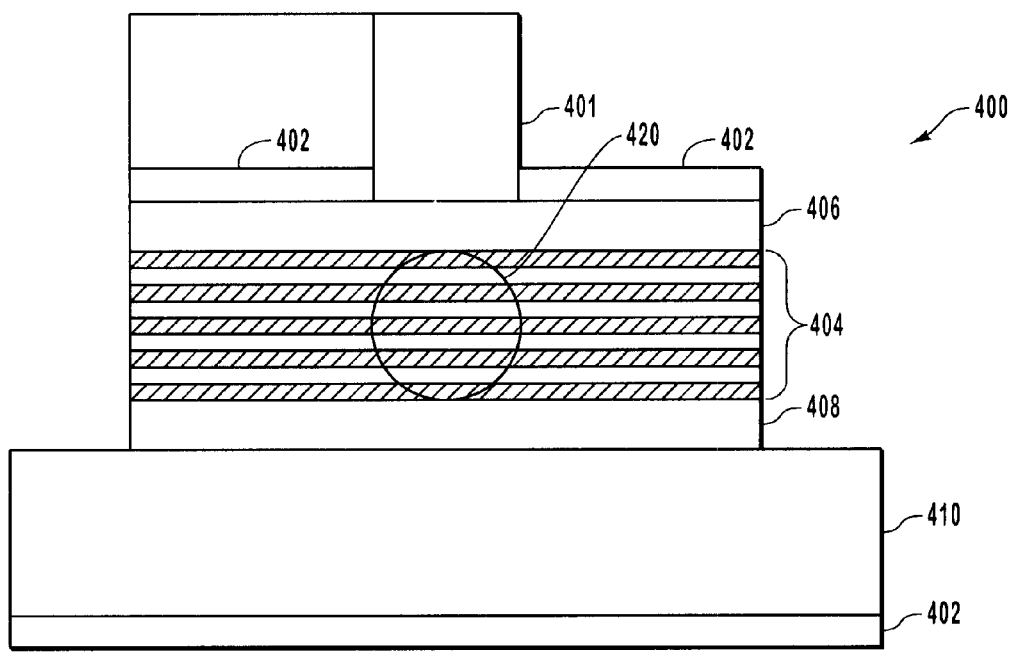
FIG. 4 illustrates a semiconductor optical amplifier that incorporates a broad area laser and that uses the gain medium of the broad area laser to amplify optical signals.

FIG. 4 is a cross sectional view of FIG. 1 and expands on FIG. 3 by illustrating a ridge waveguide 401 that enables the optical signal that is amplified to pass through the gain medium in a direction that is angularly displaced form the direction of operation of the broad area laser. As described above in reference to FIG. 6, the incident optical signal is received at the facet of the semiconductor structure at an angle that is displaced from the perpendicular by, for example, 7° to 12°. Ridge waveguide 401, which is angularly displaced from the direction of operation of the laser as shown in FIG. 1, substantially confine the optical signal to the angularly displaced direction of operation of the semiconductor optical amplifier. In order to confine the optical signal in this manner, ridge waveguide 401 is also angularly displaced by the same amount or, for example, in a range from about 7° to 12°. However, as described above, other angular displacements can be used according to the invention. The ridge part of the of waveguide 401 has an index of refraction that is smaller than that of the active region of the semiconductor structure 400. For example, the ridge part has a refractive index of 3.2 to 3.3, while the active regions has a refractive index of 3.5. The ridge waveguide effectively changes the vertical refractive index for the material beneath the ridge and thus serves as a waveguide.

While ridge waveguide 401 is formed above the active region 404 of the semiconductor structure 400, the incident optical signal that is to be amplified does not pass through the ridge waveguide. Instead, the optical signal is passed through active region 404 and has a greatest intensity directly below the ridge waveguide 401 in a region shown generally at 420. In this manner, the optical signal propagates through the same gain medium that is also used by the broad area laser.

Figure 5:
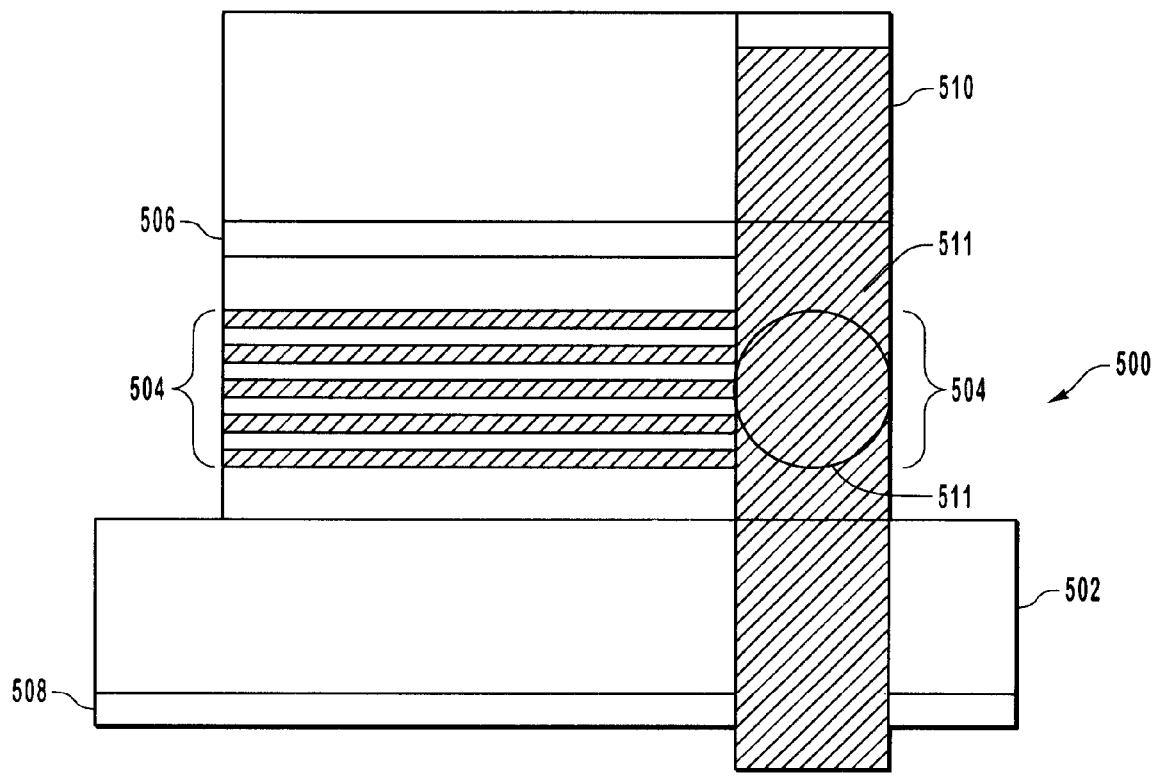
FIG. 5 illustrates a semiconductor optical amplifier having facets that are selectively coated with an antireflective coating.

FIG. 5 is an end view of the semiconductor structure of FIG. 6 and further illustrates a semiconductor optical amplifier in accordance with the present invention. FIG. 5 illustrates an end, or facet, of the semiconductor structure 500, which includes the ridge waveguide 510, the active region 504 and a substrate 502. Although not required, region 511, including a portion of the facet of the active region 504, has been coated with an antireflective (AR) coating. The AR coating is applied to further decrease the internal reflectivity of the region of the facet of the semiconductor structure that is used by the incident optical signal. In particular, region 511 encompasses a region 520 that represents the area of greatest intensity of the optical signal that has been amplified and is passing out of the facet shown in the end view of FIG. 5. The AR coating on region 504 facilitates the transmission of the amplified optical signal out of the semiconductor structure 500 and reduces the internal reflection of the amplified signal.

The AR coating can be applied using a shadow mask that exposes only region 511 in processes that will be known to those of skill in the art upon learning of the invention disclosed herein. The remainder of the facet of active region 504 is not treated with the AR coating and, accordingly, provides partial internal reflection of the laser light that is generated in the active region. Thus, the active region operates as a laser while simultaneously operating as an optical amplifier. Moreover, if, for example, the optical amplifier operates at a gain of 20 dB, the gain ripple of the optical amplifier can be as low as 0.3 dB or lower, resulting in no appreciable cross talk between wavelengths of the WDM optical signal.

As described, the semiconductor optical amplifier 500 substantially reduces or eliminates the cross talk effect that has been observed in conventional semiconductor optical amplifiers. Locking the carrier density within the active region ensures that the carrier density does not change when optical signals or channels are introduced to the semiconductor optical amplifier 500. Because the carrier density does not change, there is no appreciable cross talk between different channels. The active region is thus used for both optical amplification and for lasing to substantially reduce or eliminate cross talk.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A semiconductor optical amplifier that substantially reduces cross talk when more than one channel is incident to the semiconductor optical amplifier, the semiconductor optical amplifier comprising:

a first optical confinement layer and a second optical confinement layer;

an active region that is bounded by the first optical confinement layer and the second optical confinement layer;

a plurality of quantum wells within the active region, wherein at least one of the plurality of quantum wells is a compressively strained quantum well and wherein at least one of the plurality of quantum wells is a tensile strained quantum well; and a ridge waveguide formed at an angle on the second optical confinement layer, wherein each facet of the ridge waveguide is angled.

2. A semiconductor optical amplifier as defined in claim 1, wherein the first optical confinement layer is formed from a p-type semiconductor material and the second optical confinement layer is formed from an n-type semiconductor material.

3. A semiconductor optical amplifier as defined in claim 1, wherein the active regions is formed from a semiconductor material that has a higher refractive index than the first optical confinement layer and the second optical confinement layer.

4. A semiconductor optical amplifier as defined in claim 1, wherein each plurality of quantum wells has a thickness.

5. A semiconductor optical amplifier as defined in claim 1, wherein each facet of the ridge wave guide is tilted such that mode reflectivity is decreased.

6. A semiconductor optical amplifier as defined in claim 1, further comprising an antireflective coating that is selectively applied to each facet of the ridge waveguide and to at least one facet of the active region.

7. A semiconductor optical amplifier as defined in claim 6, wherein the antireflective coating is applied to a portion of the at least one facet of the active region such that the active region is lasing.

8. A semiconductor optical amplifier as defined in claim 7, wherein a first channel amplified in the active region and a second channel amplified in the active region are not affected by cross talk.

9. A semiconductor optical amplifier that substantially reduces cross talk when more than one channel is incident to the semiconductor optical amplifier, the semiconductor optical amplifier comprising:

a broad area semiconductor laser that includes an active region, wherein the active region includes a plurality of quantum wells, wherein a photon density and a carrier density within the active region are locked; and a ridge waveguide that includes an angled facet and is formed on the broad area semiconductor laser that guides incident optical signals such that the optical signals are amplified by the active region, wherein the incident optical signals do not lower the photon density or the carrier density such that cross talk between incident optical signals is substantially reduced.

10. A semiconductor optical amplifier as defined in claim 9, wherein the angled facet is tilted in a range from 7 to 12 degrees.

11. A semiconductor optical amplifier as defined in claim 9, wherein the active region is bounded by a first optical confinement layer and a second optical confinement layer, wherein the active region has a refractive index that is higher than a refractive index of the first optical confinement layer and a refractive index of the second optical confinement layer.

12. A semiconductor optical amplifier as defined in claim 9, wherein the plurality of quantum wells include at least one compressively strained quantum well and at least one tensile strained quantum well.

13. A semiconductor optical amplifier as defined in claim 9, further comprising a polarization adjusting layer that substantially balances transverse electric mode gain with transverse magnetic mode gain of an optical signal.

14. A semiconductor optical amplifier as defined in claim 9, wherein the ridge waveguide is formed on the broad area laser such that a propagation path of an incident optical signal is not parallel with lasing light within the active region.

15. A semiconductor optical amplifier as defined in claim 9, wherein an antireflective coating is selectively applied to the angled facet and to at least one facet of the active region.

16. A semiconductor optical amplifier that substantially reduces cross talk when more than one channel is incident to the semiconductor optical amplifier, the semiconductor optical amplifier comprising:

a broad area semiconductor laser that includes an active region, wherein the active region includes a plurality of quantum wells, including at least one compressively strained quantum well and at least one tensile strained quantum well, wherein a photon density and a carrier density within the active region are locked; and a ridge waveguide formed on the broad area semiconductor laser that guides incident optical signals such that the optical signals are amplified by the active region, wherein the incident optical signals do not lower the photon density or the carrier density such that cross talk between incident optical signals is substantially reduced.

17. A semiconductor optical amplifier as defined in claim 16, wherein the ridge waveguide comprises an angled facet that is tilted in a range from 7 to 12 degrees.

18. A semiconductor optical amplifier as defined in claim 16, wherein the active region is bounded by a first optical confinement layer and a second optical confinement layer, wherein the active region has a refractive index that is higher than a refractive index of the first optical confinement layer and a refractive index of the second optical confinement layer.

19. A semiconductor optical amplifier as defined in claim 16, further comprising a polarization adjusting layer that substantially balances transverse electric mode gain with transverse magnetic mode gain of an optical signal.

20. A semiconductor optical amplifier as defined in claim 16, wherein the ridge waveguide is formed on the broad area laser such that a propagation path of an incident optical signal is not patallel with lasing light within the active region.

21. A semiconductor optical amplifier that substantially reduces cross talk when more than one channel is incident to the semiconductor optical amplifier, the semiconductor optical amplifier comprising:

a broad area semiconductor laser that includes an active region, wherein the active region includes a plurality of quantum wells, wherein a photon density and a carrier density within the active region are locked;

a ridge waveguide formed on the broad area semiconductor laser that guides incident optical signals such that the optical signals are amplified by the active region, wherein the incident optical signals do not lower the photon density or the carrier density such that cross told between incident optical signals is substantially reduced; and a polarization adjusting layer that substantially balances transverse electric mode gain with transverse magnetic mode gain an optical signal.

* * * * *